United States Patent
Kamiya et al.

(10) Patent No.: US 6,320,474 B1
(45) Date of Patent: Nov. 20, 2001

(54) MOS-TYPE CAPACITOR AND INTEGRATED CIRCUIT VCO USING SAME

(75) Inventors: Masaaki Kamiya; Yutaka Saitoh, both of Chiba (JP)

(73) Assignee: Interchip Corporation, Chiba (JP)

( * ) Notice: Subject to any disclaimer, the term of this patent is extended or adjusted under 35 U.S.C. 154(b) by 0 days.

(21) Appl. No.: 09/473,122

(22) Filed: Dec. 28, 1999

(30) Foreign Application Priority Data

Dec. 28, 1998 (JP) .................................... 10-374448

(51) Int. Cl.⁷ .......................... H01L 29/93; H01L 29/94; H03B 5/36
(52) U.S. Cl. ...................... 331/177 V; 257/312; 257/598; 331/116 FE; 331/158; 438/379
(58) Field of Search ..................................... 257/312, 595, 257/598; 438/379; 331/36 C, 116 R, 116 FE, 177 V, 158

(56) References Cited

U.S. PATENT DOCUMENTS

| | | | | |
|---|---|---|---|---|
| 3,535,600 | * | 10/1970 | Engeler | 257/312 |
| 3,612,964 | * | 10/1971 | Kawazu | 257/312 |
| 4,704,625 | * | 11/1987 | Lee | 257/296 |
| 5,914,513 | * | 6/1999 | Shenai et al. | 257/312 |
| 6,100,770 | * | 8/2000 | Litwin et al. | 331/117 FE |
| 6,104,257 | * | 8/2000 | Mann | 331/158 |

* cited by examiner

*Primary Examiner*—Siegfried H. Grimm
(74) *Attorney, Agent, or Firm*—Huntley & Associates

(57) ABSTRACT

A MOS-type capacitor includes a semiconductor substrate of a first conductive type serving as a first electrode, a conductor layer formed on the semiconductor substrate via a capacitive insulation film and serving as a second electrode, and an impurity region of a second conductive type formed in the vicinity of the surface of the semiconductor substrate at a location in proximity to a region facing the conductor layer. The MOS-type capacitor is used as a variable capacitor in a VCO (voltage-controlled oscillator) having a widened frequency range.

9 Claims, 9 Drawing Sheets

CONTROL VOLTAGE (V)

PRIOR ART

PRIOR ART

MOS-TYPE CAPACITOR AND INTEGRATED CIRCUIT VCO USING SAME

BACKGROUND OF THE INVENTION

1. Field of the Invention

The present invention relates to a MOS-type capacitor suitable for an oscillation circuit which is used in, for example, electronic equipment and which utilizes a resonator such as a quartz resonator or a ceramic resonator, and whose oscillation frequency can be controlled through application of voltage thereto (hereinafter referred to as a VCO (Voltage Controlled Oscillator)), as well as to a semiconductor integrated circuit device comprising a VCO whose oscillation frequency can be changed within a widened range through application of a control voltage to thereby enable fine adjustment of electronic equipment and which can be produced at a reduced cost.

2. Description of the Related Art

FIG. 8 is a graph showing the temperature drift of an oscillation frequency of a crystal oscillator utilizing a typical AT-cut quartz. The vertical axis represents temperature drift $\Delta f/f_0$ (ppm), where $f_0$ is an oscillation frequency at 25° C., and the horizontal axis represents temperature (°C.). As is apparent from the graph, the oscillation frequency changes within a range of ±40 ppm when the temperature changes from −40° C. to +90° C. Further, AT-cut quartz resonators mass-produced under the same conditions deviate from each other in oscillation frequency by as much as 30 to 50 ppm. If the oscillation frequency of electronic equipment, especially a cellular phone or portable information terminal which uses radio waves, deviates from a target frequency due to the above-described causes, various problems occur. Accordingly, the oscillation frequency must be adjusted such that the deviation comes within a range of ±10 ppm, more preferably ±1 ppm. For such a purpose, a VCO capable of changing its oscillation frequency in accordance with an applied control voltage is used.

FIG. 9 is a circuit diagram of a typical VCO utilizing a quartz resonator or a ceramic resonator. The VCO has external connection terminals 121 and 122 to which a quartz resonator 110 is connected. Also, the VCO comprises a CMOS inverter 123, which constitutes an amplifier in cooperation with a bias resistor (Rf) 126 connected between the input node 124 and the output node 125 of the CMOS inverter 123. A resistor (Rd) 127 is connected between the output node 125 and the external connection terminal 122. Although the resistor 127 is frequently omitted in the case of oscillation circuits of 1 MHz or higher, provision of the resistor 127 is recommended from the viewpoint of the stability of the oscillation frequency. A capacitor (Cd) 128 is connected to the external connection terminal 122. Meanwhile, a capacitor (Cg) 131, a PN-junction capacitor (having the same configuration as that of a PN-junction diode) serving as a variable capacitance element (Di) 132, and a resistor (R1) 133 are connected to the external connection terminal 121 via a capacitor (Cp) 130 for shutting off DC voltage. The other terminal of the resistor (R1) 133 is connected to a Vc terminal 134. An external capacitor for adjustment may be connected to the external connection terminal 122.

The resistor (RD) 127, the quartz resonator 110, the capacitor (Cd) 128, the capacitor (Cg) 131, the PN-junction capacitor serving as a variable capacitance element (Di) 132, and the capacitor (Cp) 130 constitute a resonance circuit, which is driven by the amplifier formed of the CMOS inverter 123 and the bias resistor (Rf) 126. Further, the output from the resonance circuit is fed back to input terminal 124 of the amplifier via the external connection terminal 1221, to which is connected one terminal of the quartz resonator 110 opposite the terminal connected to the output side of the amplifier. Further, a frequency control voltage is input from the Vc terminal 134 to the PN-junction capacitor (Di) 132 via the resister (R1) 133.

In such a circuit configuration, the synthetic capacitance formed of the capacitor (Cd) 128, the capacitor (Cg) 131, the PN-junction capacitor (Di) 132, and the DC-cut capacitor (Cp) 130 of the resonance circuit determine the oscillation frequency $f_0$. Accordingly, when the capacitance of the PN-junction capacitor (Di) 132 is changed by means of voltage input from the Vc terminal 134, the oscillation frequency $f_0$ changes.

A curve 72 shown in FIG. 4 represents the voltage-capacitance characteristic (C-V characteristic) of the PN-junction capacitor (Di) 132. In FIG. 4, the horizontal axis represents control voltage, and the vertical axis represents capacitance. When the control voltage is changed within a range of 0 to 4 volts, the capacitance per unit area becomes about one half.

As described above, in the case where a PN-junction capacitor is used as a variable capacitance element, the capacitance becomes about one half upon increase of the control voltage from 0 to about 4 volts. In the case of a quartz resonator being used, variation in oscillation frequency $\Delta f/f_0$ caused by such a capacitance change becomes about ±80 ppm.

By contrast, deviation in oscillation frequency is caused by not only temperature drift and production variation among resonators, but also several other factors. Therefore, in many cases, a tuning amount as large as ±80 ppm is insufficient, and a variation amount of ±100 to ±200 ppm is required. Even in the case of a PN-junction capacitor, the capacitance variation ratio can be increased when the concentration of impurities in the vicinity of the PN-junction is controlled to have a certain profile. However, there are many difficulties when such a PN-junction capacitor is formed on the same semiconductor substrate as that of a MOS circuit, CMOS circuit, or the like which constitutes, for example, an amplifier.

Although a scheme in which a plurality of PN-junction capacitors are selectively used through switching may be employed in order to increase the correction amount, this results in an increase in chip size and an increase in complexity of the tuning system.

Another drawback involved in the PN-junction capacitor is loss of oscillation frequency stability which occurs when the DC control voltage applied to the Vc terminal 134 is near 0 V. That is, when the oscillation amplitude of the oscillator exceeds 0.6 V in a state in which the DC control voltage applied to the Vc terminal 134 is near 0 V, forward current flows through the PN-junction capacitor, because the PN-junction capacitor has the same configuration as that of a diode. In this case, the oscillation frequency becomes unstable.

Meanwhile, a MOS-type capacitor has been used as a variable capacitance element. The MOS-type capacitor has a structure as shown in FIG. 10.

FIG. 10 shows a schematic cross-sectional view of such a MOS-type capacitor. A polysilicon gate electrode 153—which forms a MOS capacitor—is provided on a P⁻-type semiconductor substrate 151 via an insulation film 154.

In such a MOS-type capacitor, when a positive voltage is applied to the gate electrode 153, a depletion layer 155 is formed within the P⁻-type semiconductor substrate 151 in the vicinity of the surface thereof. When the positive voltage applied to the gate electrode 153 is increased, a strong inversion layer is formed at the surface of the substrate, so that an increase in the thickness of the depletion layer saturates or stops regardless of the applied voltage.

The capacitance C of the MOS-type capacitor is the series capacitance of the capacitance Co of the insulation film 154 and the capacitance of the depletion layer 155. Accordingly, although the synthetic capacitance initially decreases as the voltage applied to the gate electrode 153 increases, the decrease in capacitance saturates when a strong inversion layer is formed.

SUMMARY OF THE INVENTION

In view of the foregoing, an object of the present invention is to provide a MOS-type capacitor and a semiconductor integrated circuit device using the same capacitor which can solve the above-described problems.

To achieve the above objective, the present invention provides a MOS-type capacitor comprising: a semiconductor substrate of a first conductive type serving as a first electrode; a conductor layer formed on the semiconductor substrate via a capacitive insulation film and serving as a second electrode; and an impurity region of a second conductive type formed in the vicinity of the surface of the semiconductor substrate at a location in proximity to a region facing the conductor layer.

Preferably, the capacitance of the MOS-type capacitor changes with a control voltage applied to the conductor layer. In this case, the MOS-type capacitor is preferably used in a state in which a DC voltage is applied to the second-conductive-type impurity region. In this case, the DC voltage preferably serves as a reverse voltage against a diode formed by the semiconductor substrate and the second-conductive-type impurity region.

Preferably, the conductor layer is provided such that a flat band voltage becomes close to 0 V.

Preferably, a high-concentration layer of the first conductive type is provided in the semiconductor substrate at least in the vicinity of the surface of the region facing the conductor layer.

Preferably, a high-concentration region of the first conductive type is provided in the semiconductor substrate at a location in proximity to the circumferential edge of the region facing the conductor layer.

The present invention also provides a semiconductor integrated circuit device comprising a voltage-controlled oscillation circuit which in turn comprises, as constituent elements, an oscillation amplifier and a variable capacitor whose capacitance can be changed in accordance with a control voltage, wherein the variable capacitor is formed of a MOS-type capacitor comprising: a semiconductor substrate of a first conductive type serving as a first electrode; a conductor layer formed on the semiconductor substrate via a capacitive insulation film and serving as a second electrode; and an impurity region of a second conductive type formed in the vicinity of the surface of the semiconductor substrate at a location in proximity to the conductor layer.

Preferably, the capacitance of the MOS-type capacitor changes with a control voltage applied to the conductor layer. In this case, the MOS-type capacitor is preferably used in a state in which a DC voltage is applied to the second-conductive-type impurity region. In this case, the DC voltage preferably serves as a reverse voltage against a diode formed by the semiconductor substrate and the second-conductive-type impurity region.

Preferably, the conductor layer is provided such that a flat band voltage becomes close to 0 V.

Preferably, a high-concentration layer of the first conductive type is provided in the semiconductor substrate at least in the vicinity of the surface of the region facing the conductor layer.

Preferably, a high-concentration region of the first conductive type is provided in the semiconductor substrate at a location in proximity to the circumferential edge of the region facing the conductor layer.

Preferably, the fabrication process of the MOS-type capacitor is compatible with that of an MOS integrated circuit or a CMOS integrated circuit.

The MOS-type capacitor according to the present invention can be used as a voltage-controlled variable capacitance element in place of a PN-junction-type capacitor. As described above, the MOS-type capacitor has a structure such that a conductive electrode (gate electrode) formed of polysilicon or silicide of a high-melting-point metal is provided on a semiconductor substrate via an insulation film formed thereon (which may be formed in a process similar to that for formation of a gate insulation film of a MOS transistor). When the semiconductor substrate is of a P-type, an impurity region of an N-type, which is opposite the conductive type of the substrate, is provided in the vicinity of the gate electrode in a plane view; i.e., in the vicinity of the region facing the gate electrode. Further, the MOS-type capacitor is constructed so as to enable application of voltage to the N-type impurity region. Such a novel MOS-type capacitor is advantageously used as a voltage-controlled variable capacitance element of a VCO.

DESCRIPTION OF THE PREFERRED EMBODIMENTS

Embodiments of the present invention will be described with reference to the drawings.

Figure 1:
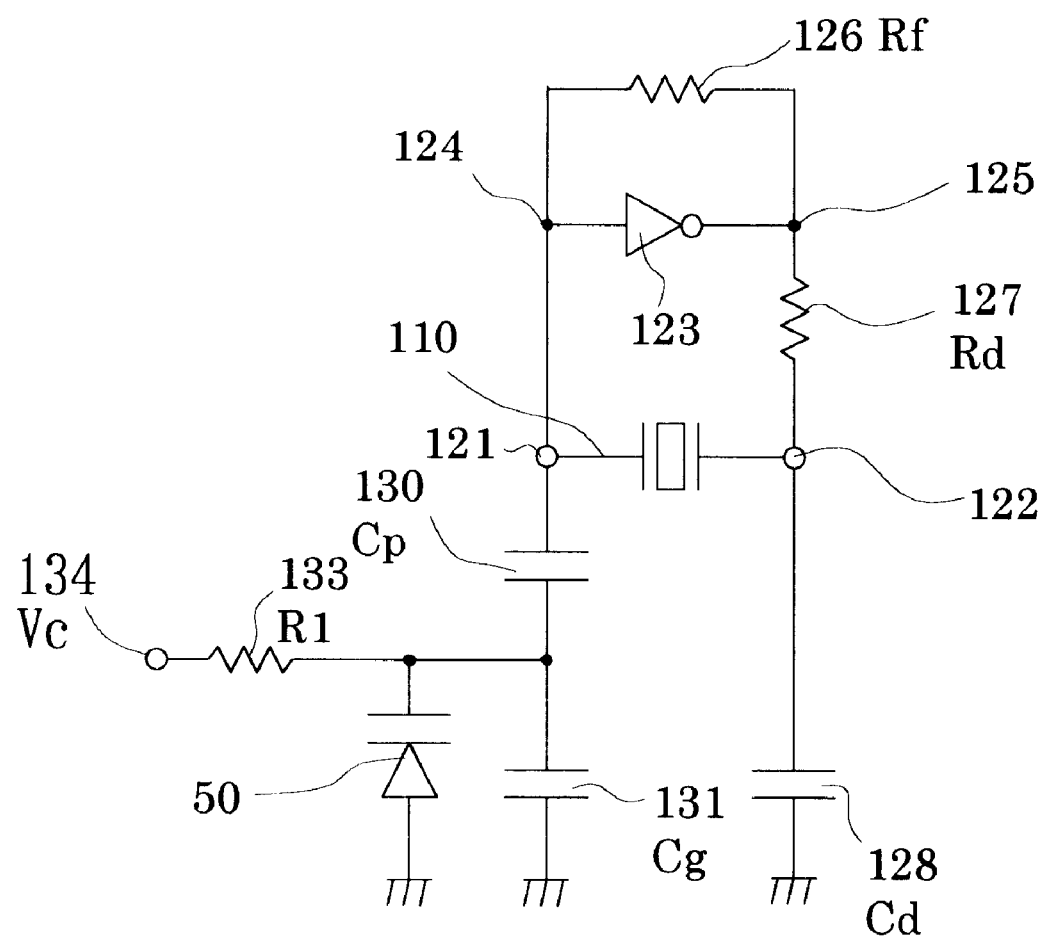
FIG. 1 is a circuit diagram of a VCO circuit according to an embodiment of the present invention.

FIG. 1 is a circuit diagram of a semiconductor integrated circuit device according to an embodiment of the present invention, showing a VCO circuit which utilizes an external resonator such as a ceramic resonator or a quartz resonator connected thereto. The VCO circuit is identical with the conventional VCO circuit described with reference to FIG. 9, except that the PN-junction capacitor (Di) 132 serving as a variable capacitance element is replaced with a MOS-type capacitor 50. Therefore, components providing the same functions are denoted by the same reference numbers and their descriptions are omitted in order to avoid redundancy.

Figure 9:
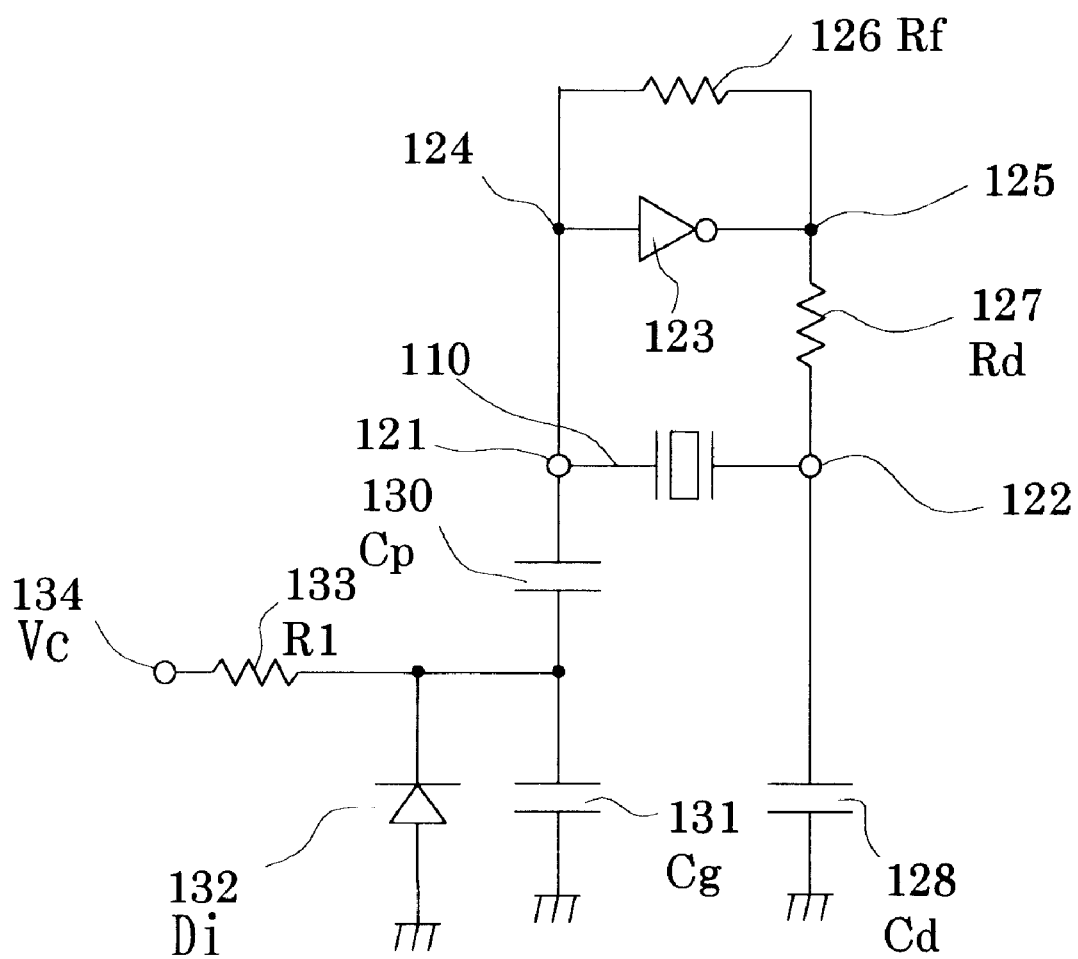
FIG. 9 is a circuit diagram of a conventional VCO.

As in the case of the conventional VCO circuit shown in FIG. 9, in the VCO circuit shown in FIG. 1, a frequency control voltage is input from the Vc terminal 134 to the MOS-type capacitor 50 via the resistor (R1) 133. In cooperation with the capacitor (Cd) 128, the capacitor (Cg) 131, and the DC-cut capacitor (Cp) 130 of the resonance circuit, the MOS-type capacitor 50 forms a synthetic capacitance which determines the oscillation frequency $f_0$.

Figure 2:
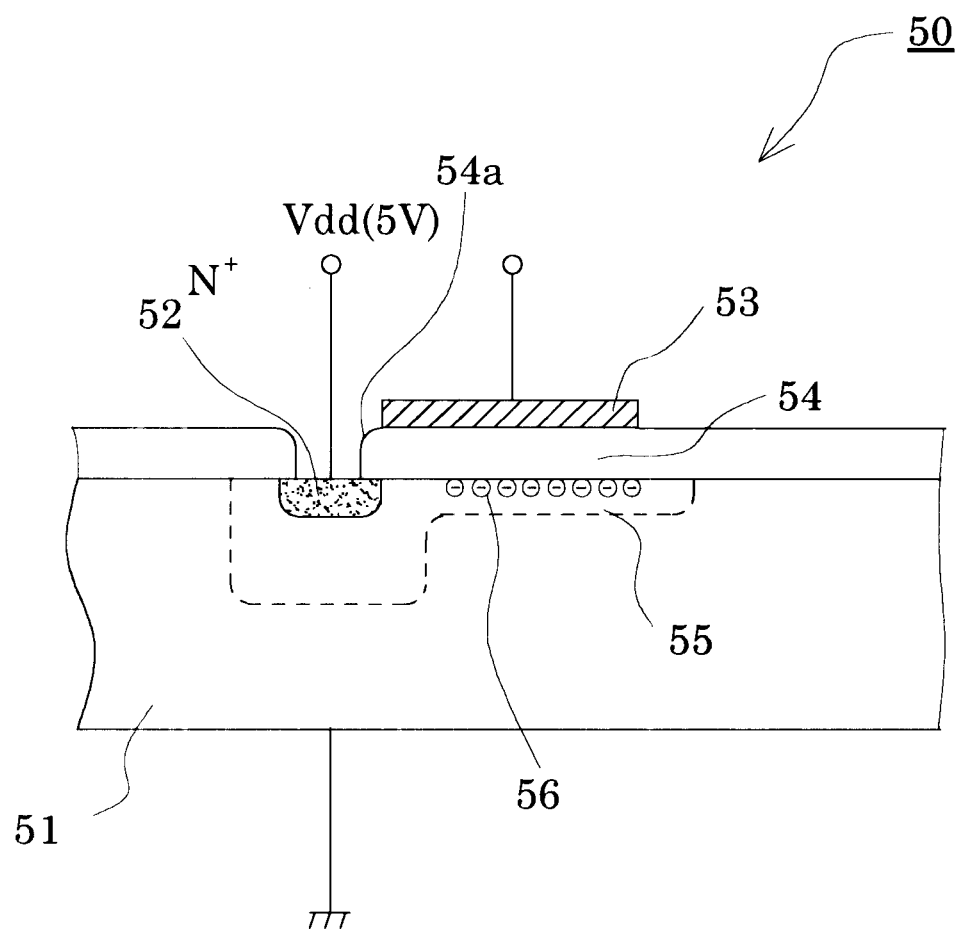
FIG. 2 is a schematic sectional view of a novel MOS-type capacitor used in the VCO circuit according to the embodiment of the present invention.

The structure of the MOS-type capacitor 50 according to the present embodiment will be described with reference to FIG. 2, which is a schematic sectional view of the MOS-type capacitor 50.

A polysilicon gate electrode 53—which forms a MOS capacitor—is provided on a P⁻-type semiconductor substrate 51 via an insulation film 54. Further, an N⁺-type impurity region 52 is formed in the P⁻-type semiconductor substrate 51 at a position in the vicinity of a region facing the gate electrode 53. Further, a contact hole 54a is formed in the insulation film 54 at a position facing the N⁺-type impurity region 52 in order to enable application of voltage to the N⁺-type impurity region 52. In addition to these elements, a depletion layer region 55, which appears depending on the voltage of the gate electrode 53, and surface charges 56, which appear when the semiconductor substrate 51 comes into a strong inversion state, are shown in FIG. 2 in order to describe the operation of the MOS-type capacitor.

The capacitance C of the MOS-type capacitor is the serially-synthetic capacitance of the capacitance $C_0$ of the insulation film 54 and the capacitance of the depletion layer 55. Accordingly, as the voltage applied to the gate electrode 53 increases, the synthetic capacitance decreases.

At this time, the conventional MOS-type capacitor not having the N⁺-type impurity region 52 (see FIG. 10) raises a problem such that the decrease in capacitance saturates or stops when a strong inversion layer is formed.

The strong inversion state is conceivably a state in which, due to a build-up of minority carriers (electrons in the case of a P-type substrate) from the interior of the substrate, the surface potential of the substrate is fixed at a potential in a thermal equilibrium state (about 0.6 V) regardless of the voltage applied to the gate electrode 53.

By contrast, in the MOS-type capacitor of the present embodiment, the N⁺-type impurity region 52 is formed in the vicinity of a region facing the gate electrode 53. Therefore, when a reverse voltage is applied to the N⁺-type impurity region 52—which forms a diode in cooperation with the P⁻-type substrate 51—in order to bias the N⁺-type impurity region 52 in the reverse direction, minority carriers that move to the substrate surface are absorbed by the reversely-biased N⁺-type impurity region 52, so that a strong inversion state is barely created. That is, the reversely-biased N⁺type impurity region 52 enables the depletion layer to grow with the voltage applied to the gate electrode 53 without saturation. For example, when a voltage Vdd (=5 V) is applied to the N⁺-type impurity region 52 as a reverse voltage, the thickness of the depletion layer increases continuously until the potential at the surface of the depletion layer relative to the P⁻ substrate 51 reaches 5.6 V. Accordingly, in the MOS-type capacitor according to the present invention, the capacitance C can be varied within a widened range.

Figure 3:
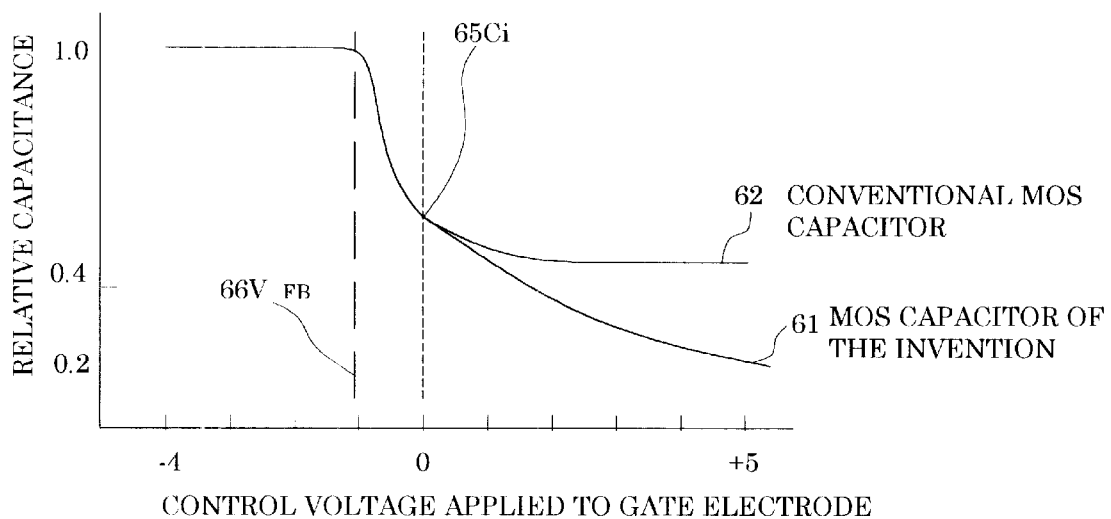
FIG. 3 is a graph showing the C-V characteristic of the MOS-type capacitor shown in FIG. 2.

This is shown in FIG. 3. In FIG. 3, the horizontal axis represents the control voltage applied to the gate electrode, and the vertical axis represents a relative capacitance of the MOS capacitance; i.e., the ratio of the differential capacitance C (capacitance for an AC signal having a very small amplitude) of the MOS capacitor as viewed from the gate electrode to the capacitance Co of the insulation film itself.

Figure 10:
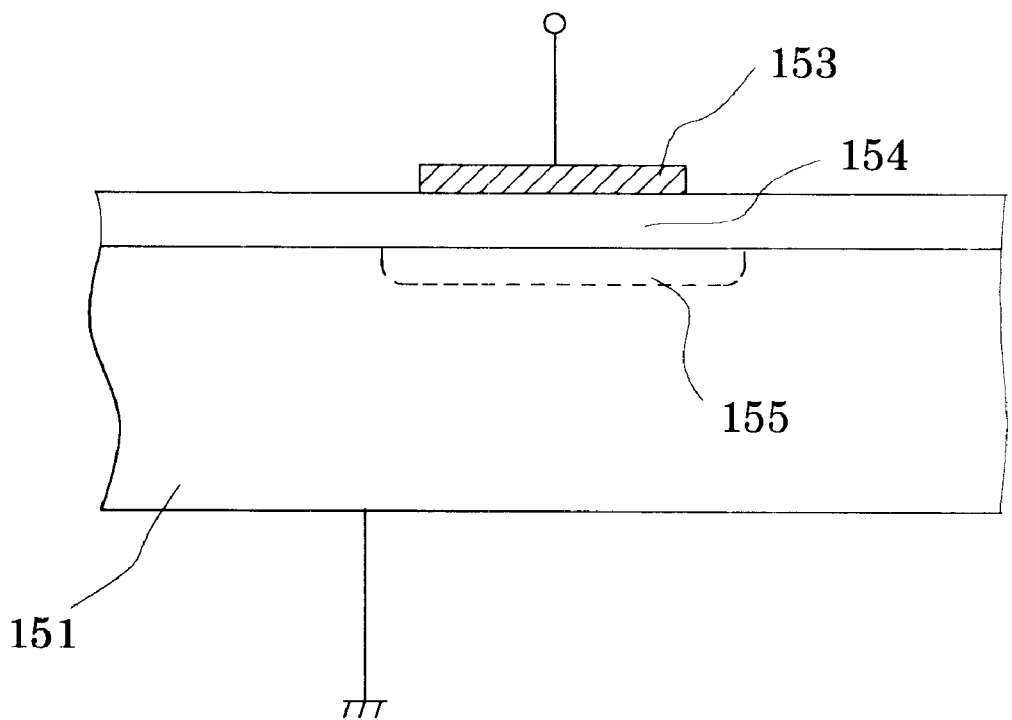
FIG. 10 is a schematic sectional view of a conventional MOS-type capacitor.

Curve 61 represents variation in capacitance of the MOS-type capacitor according to the present invention, and curve 62 represents variation in capacitance of the conventional MOS-type capacitor shown in FIG. 10. This graph demonstrates that in the MOS-type capacitor of the present invention, as the voltage applied to the gate electrode increases, relative capacitance decreases.

Figure 4:
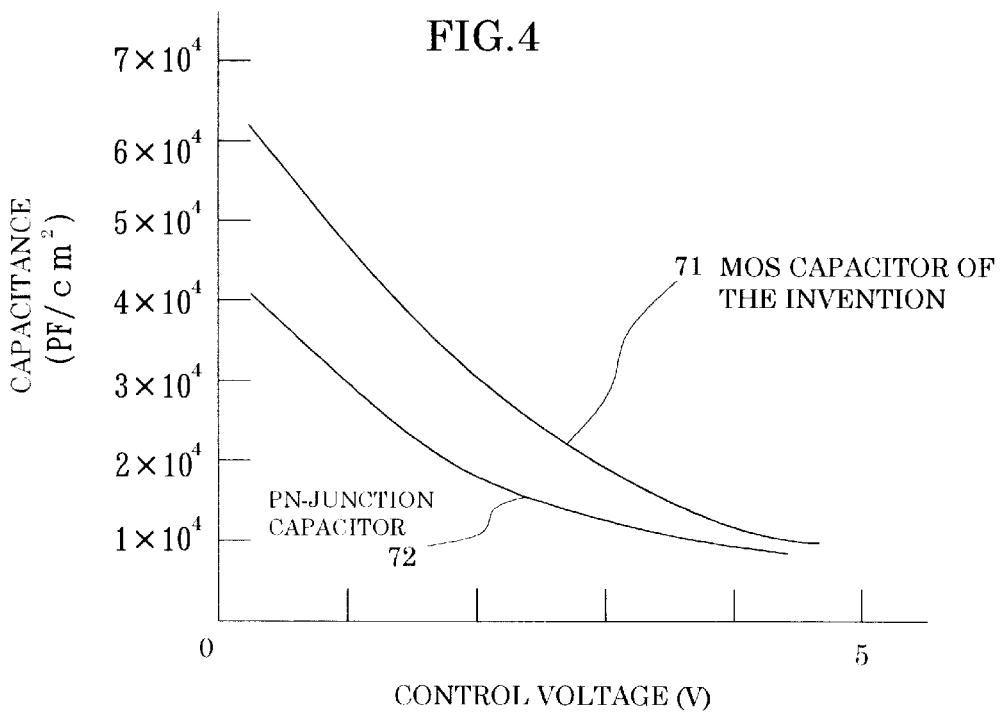
FIG. 4 is a graph showing a difference in C-V characteristic between the MOS-type capacitance and the PN-junction-type capacitor.

FIG. 4 is a graph showing the difference in C-V characteristics between the MOS-type capacitance and the PN-junction-type capacitor. In FIG. 4, the horizontal axis represents applied voltage (V), and the vertical axis represents capacitance per unit area.

Curve 71 represents the C-V characteristics of the MOS-type capacitor of the present invention, and curve 72 represents the C-V characteristics of the PN-junction-type capacitor. This graph demonstrates that the capacitance variation rate according to the C-V characteristics of the MOS-type capacitor of the present invention is greater than that of the PN-junction-type capacitor.

Figure 5A:
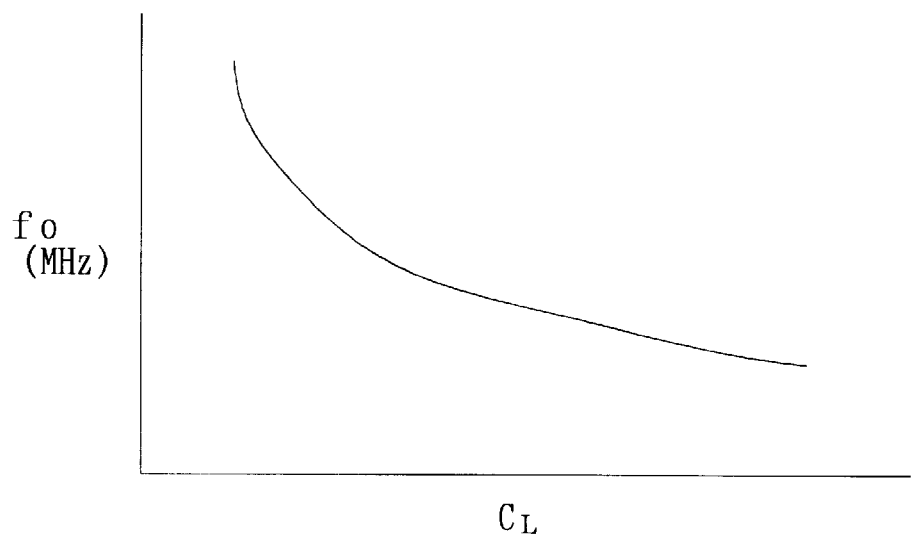
FIG. 5(a) is a graph schematically showing variation in oscillation frequency with synthetic capacitance $C_L$ of Cg and Cd in the VCO circuit of the present invention.
Figure 5B:
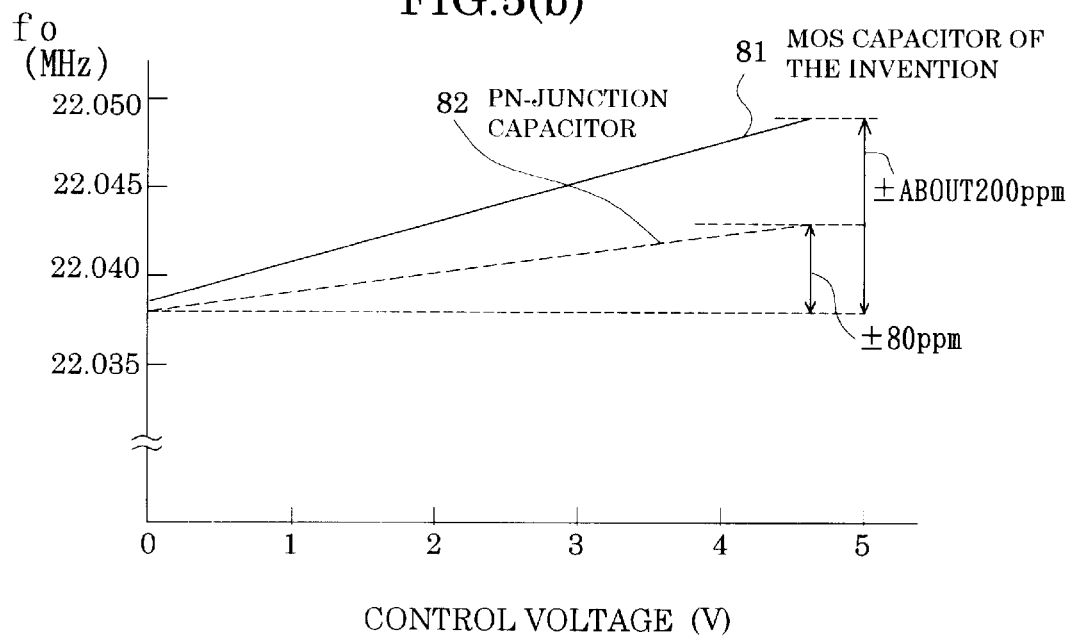
FIG. 5(b) is a graph for comparing a VCO using a PN-junction capacitor and a VCO using the novel MOS capacitor, in terms of the relationship between control voltage and oscillation frequency.
Figure 8:
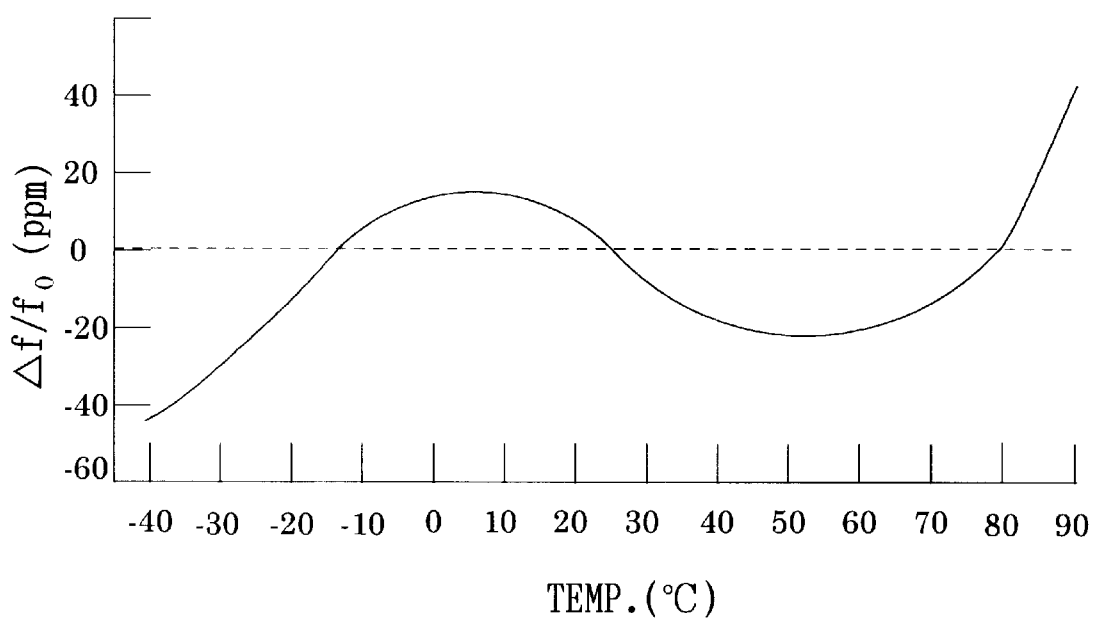
FIG. 8 is a graph showing temperature drift of oscillation frequency of a typical AT-cut quartz.

FIG. 5(a) is a graph schematically showing variation in oscillation frequency of the VCO circuit with synthetic capacitance $C_L$ of Cg, Cd, etc., in the VCO circuit. The horizontal axis represents the synthetic capacitance $C_L$, and the vertical axis represents oscillation frequency $f_0$ (MHz). FIG. 5(b) is a graph for comparing the conventional VCO shown in FIG. 8 and the VCO according to the present invention shown in FIG. 1 in terms of the relationship between control voltage applied to the variable capacitance element and oscillation frequency (hereinafter referred to as a "frequency variation characteristic").

As shown in FIG. 5(b), according to the frequency variation characteristic 82 of the PN-junction-type capacitor, the frequency can be adjusted within a range of about ±80 ppm, according to the control voltage Vc within a range of 0 to 4 V. By contrast, according to the frequency variation characteristic 81 of the MOS capacitor according to the present invention, the frequency variation range can be doubled or more.

In VCO circuits generally used, the control voltage is unipolar; that is, in the case shown in FIG. 1, voltage between 0 V to +3 or 4 V is used, and negative voltage is not used. Accordingly, in order to widen the capacitance variation range in the positive voltage range, it is necessary to make large the capacitance at the control voltage of 0 V which is noted as (Ci) 65 in FIG.3 when the control voltage is 0 V. The following three measures may be employed in order to increase the capacitance (Ci) 65.

First measure: Flat band voltage ($V_{FB}$) 66 shown in FIG. 3 is made closer to 0 V. For such purpose, the gate electrode 53 may be formed of a material having the same work function as that of the P⁻ substrate, or may be formed of a silicon of the same conductive type as the P⁻ substrate.

Employment of such a gate electrode enables the flat band voltage ($V_{FB}$) 66 to approach 0 V to thereby increase the capacitance (Ci) 65.

Figure 6:
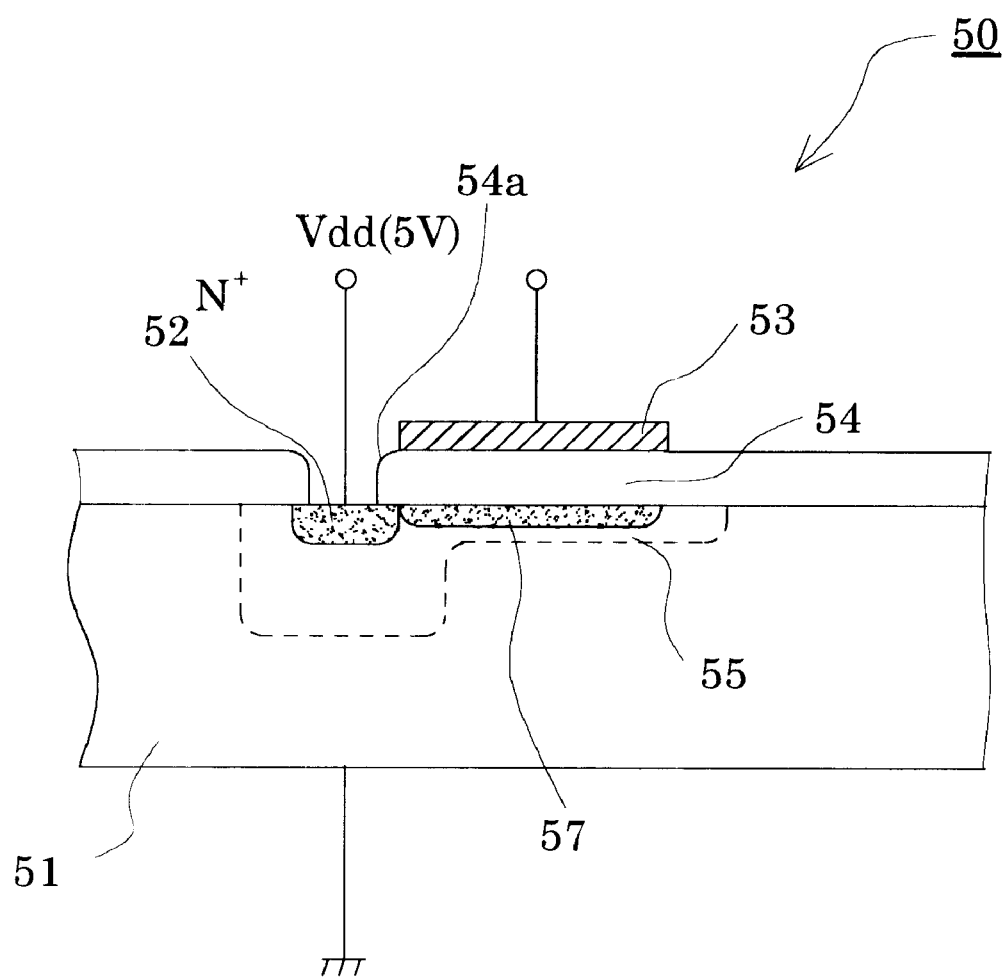
FIG. 6 is a schematic sectional view of a MOS-type capacitor according to another embodiment of the present invention.

Second measure: Through ion implantation or any other suitable method, a high-concentration P-type layer is formed in the vicinity of the surface of the P⁻ substrate 51 in order to reduce the thickness of the depletion layer when the voltage applied to the gate electrode 53 is not greater than 0 V. Specifically, as shown in FIG. 6, through provision of a P⁺-type layer 57 in a region facing the gate electrode 53, the thickness of the depletion layer at the time when the potential of the gate electrode 53 is not greater than 0 V can be kept thin and the capacitance (Ci) 65 can be kept large.

Third measure: The impurity concentration of the P⁻ substrate 51 is reduced to a possible extent. It is effective to combine the third measure with the second measure. The third measure increases the thickness of the depletion layer at the time when a positive voltage is applied to the gate electrode 53. Since the capacitance at the time when the control voltage is high is lowered, the capacitance variation range can be widened.

Next, an example structure of a MOS-type capacitor having improved characteristics will be described with reference to FIG. 7.

When the capacitance variation range of the MOS-type capacitor is to be increased, the impurity concentration of the P⁻-type substrate 51 is desirably decreased. However, when the impurity concentration of the P⁻-type substrate 51 is low, a parasitic series resistance is formed between the P⁻-type substrate 51 and the gate electrode 53 located at the surface of the substrate. When the parasitic resistance is large, operation of the oscillator is greatly affected. In the present embodiment, in order to eliminate such a parasitic resistance, a P⁻-type region 58—which is a P-type high-concentration region—is formed in the P⁻-type substrate 51 at a position in the vicinity of the circumferential edge of the region facing the gate electrode 53.

Figure 7A:
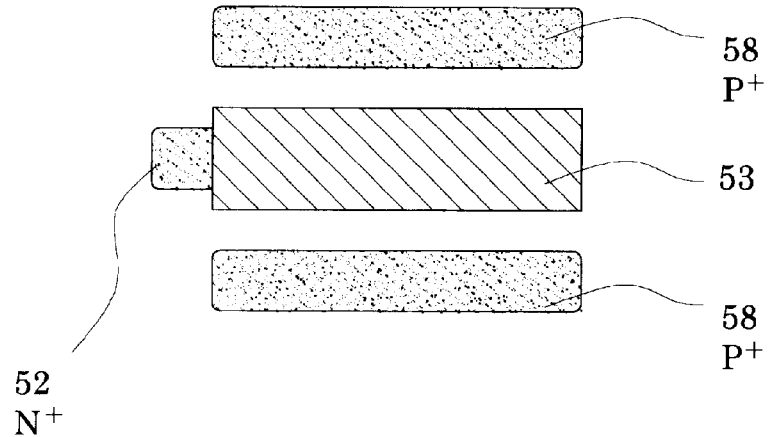
FIGS. 7(a)–7(c) are plane and sectional views of the MOS-type capacitor shown in FIG. 6.

Since the P⁺-type region 58 is formed in order to decrease the parasitic resistance, as shown in FIG. 7(a), the P⁺-type region 58 is disposed such that the distance between the P⁺-type region 58 and the region facing the gate electrode 53 becomes small, and the boundary between the P⁺-type region 58 and the region facing the gate electrode 53 becomes long. Thus, the parasitic resistance can be reduced to a level at which the influence of the parasitic resistance is ignorable. Accordingly, in the present embodiment, two of the P⁺-type regions 58 are provided to extend along either longer side of the gate electrode 53, and the N⁺-type impurity region 52 is provided to extend along a shorter side of the gate electrode 53. This structure provides a remarkable effect when used in combination with the above-described third measure.

Figure 7B:
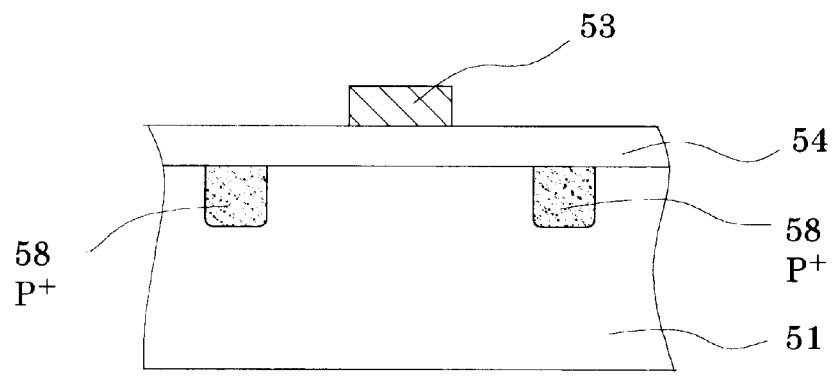
Figure 7C:
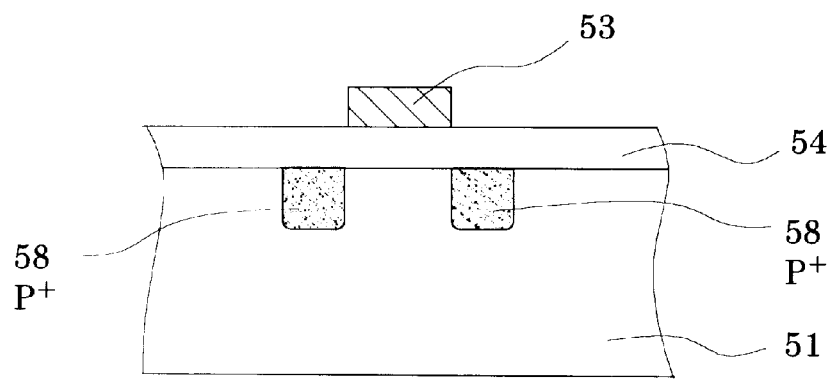

In the structure shown in FIGS. 7(a) and 7(b), the P⁺-type regions 58 are formed such that the P⁺-type regions 58 are slightly separated from the gate electrode 53. However, as shown in FIG. 7(c), the P⁺-type regions 58 may be formed in a self-aligned manner.

The above-described MOS-type capacitor of the present invention has not only a widened capacitance variation range but also the following advantageous features as a capacitor element. In the conventional PN-junction-type capacitor, when the voltage applied to the PN-junction becomes negative (when a forward voltage is applied to a diode formed by the capacitor), a forward current flows therethrough, so that the PN-junction-type capacitor becomes a low-quality capacitor having a resistance component. By contrast, in the MOS-type capacitor according to the present embodiment, such a problem does not occur, because the gate electrode is isolated from the semiconductor substrate by means of the insulation film.

Finally, a method for fabricating the MOS-type capacitor according to the present invention will be described. As shown in FIG. 2, the MOS-type capacitor has a structure very similar to that of an NMOS transistor (structure obtained through removal of either a drain or source from an NMOS transistor). Therefore, the capacitive insulation film 54 can be formed in a step in which a gate oxide film of an NMOS transistor is formed, and the N⁺-type impurity region 52 can be formed in a step in which the source and drain of the NMOS transistor are formed. It is desirable to form the N⁺-type impurity region 52 such that the distance between the N⁺-type impurity region 52 and the gate electrode 53 is minimized but overlap therebetween (where an unnecessary capacitor is formed) is also minimized. An ideal structure satisfying these requirements can be obtained by a method in which N-type impurities are implanted in a self-aligned manner relative to the gate electrode 53, similar to a method for fabricating an NMOS transistor on the same semiconductor substrate.

Also, the P⁺ regions 58 shown in FIGS. 7(a) and 7(b) can be formed in a CMOS integrated circuit device in the same step as that for formation of the source and drain of a PMOS transistor.

Rendering the flat band voltage $V_{FB}$ of the MOS-type capacitor close to 0 V—which has been described as a measure for increasing the capacitance variation range of the MOS-type capacitor—can be accomplished easily in a process for fabricating a dual gate CMOS integrated circuit. In the dual gate CMOS process, since P⁺ polysilicon is used for the gate electrode of an NMOS transistor, the P⁺ polysilicon can be used for formation of the gate electrode shown in FIGS. 2 and 6. As described above, even when a MOS-type capacitor is fabricated such that the flat band voltage $V_{FB}$ becomes close to 0 V, its fabrication process can be designed to eliminate an additional process or step.

However, since the dual gate CMOS process is not standard, there will be described a different method for forming a P-type high-concentration layer (P⁺-type layer 57) in the vicinity of the surface on the P⁻-type substrate, as shown in FIG. 6, in order to widen the capacitance variation range of the MOS-type capacitor. The simplest manner for forming such a high-concentration layer is utilization of ion implantation performed in a process of fabricating an ordinary NMOS transistor. Specifically, since a P-type impurity is introduced, through ion implantation, into a channel region of an NMOS transistor in order to adjust the threshold of the transistor, a P-type impurity can be implanted into the substrate surface of the MOS-type capacitor simultaneously with such ion implantation. By use of this method, the capacitance variation range of the MOS-type capacitor can be increased to a satisfactory level.

As described above, the MOS-type capacitor according to the present invention having a widened capacitance variation range can be fabricated by a fabrication process for ordinary MOS and CMOS integrated circuits, without any additional steps.

In the above-described embodiments, the MOS-type capacitor of the present invention is formed on a P⁻ substrate. However, the MOS-type capacitor of the present invention can be formed on a P substrate as well. Further, a MOS-type capacitor having an electrically reverse polarity can be fabricated through formation in an N-type substrate or N as well as an impurity region of a type which is the reverse of that in the above-described embodiment.

As described above, the present invention realizes a MOS-type capacitor having a widened capacitance variation range and can be advantageously used in a semiconductor integrated circuit device constituting a VCO circuit. Further, the MOS-type capacitor of the present invention can be integrated easily with other circuits, so that size and cost can be reduced.

What is claimed is:

1. A MOS-type capacitor comprising:
   a semiconductor substrate of a first conductive type serving as a first electrode;
   a conductor layer formed on the semiconductor substrate via a capacitive insulation film and serving as a second electrode; and
   an impurity region of a second conductive type formed in the vicinity of the surface of the semiconductor substrate at a location in proximity to a region facing the conductor layer, wherein a DC voltage is applied to the second-conductive-type impurity region, the DC voltage serving as a reverse voltage against a diode formed by the semiconductor substrate and the second-conductive-type impurity region; and through application of a control voltage applied to the conductor layer, the capacitance of a capacitor element formed between the first and second electrodes is changed.

2. A MOS-type capacitor according to claim 1 wherein the conductor layer is provided such that a flat band voltage becomes close to 0 V.

3. A MOS-type capacitor according to claim 1 wherein a high-concentration layer of the first conductive type is provided in the semiconductor substrate at least in the vicinity of the surface of the region facing the conductor layer.

4. A MOS-type capacitor according to claim 1 wherein a high-concentration region of the first conductive type is provided in the semiconductor substrate at a location in proximity to the circumferential edge of the region facing the conductor layer.

5. A semiconductor integrated circuit device comprising a voltage-controlled oscillation circuit which in turn comprises, as constituent elements, an oscillation amplifier and a variable capacitor whose capacitance can be changed in accordance with a control voltage, wherein the variable capacitor is formed of a MOS-type capacitor comprising:
   a semiconductor substrate of a first conductive type serving as a first electrode;
   a conductor layer formed on the semiconductor substrate via a capacitive insulation film and serving as a second electrode; and
   an impurity region of a second conductive type formed in the vicinity of the surface of the semiconductor substrate at a location in proximity to the conductor layer, wherein a DC voltage is applied to the second-conductive-type impurity region, the DC voltage serving as a reverse voltage against a diode formed by the semiconductor substrate and the second-conductive-type impurity region; and through application of a control voltage applied to the conductor layer, the capacitance of a capacitor element formed between the first and second electrodes is changed.

6. A semiconductor integrated circuit device according to claim 5 wherein the conductor layer is provided such that a flat band voltage becomes close to 0 V.

7. A semiconductor integrated circuit device according to claim 5 wherein a high-concentration layer of the first conductive type is provided in the semiconductor substrate at least in the vicinity of the surface of the region facing the conductor layer.

8. A semiconductor integrated circuit device according to claim 5 wherein a high-concentration region of the first conductive type is provided in the semiconductor substrate at a location in proximity to the circumferential edge of the region facing the conductor layer.

9. A semiconductor integrated circuit device according to claim 5 wherein the MOS-type capacitor is fabricated in a process for fabricating a MOS integrated circuit or a CMOS integrated circuit.

* * * * *